United States Patent [19]

Brovelli

[11] Patent Number: 4,703,194
[45] Date of Patent: Oct. 27, 1987

[54] TOUCH OPERATED ELECTRONIC SWITCH FOR ALTERNATING CURRENT

[75] Inventor: Jacques C. J. Brovelli, Molières sur Cèze, France

[73] Assignee: Philiffe J. H. Berna, Molieres-sur-Cèze, France

[21] Appl. No.: 768,761

[22] Filed: Aug. 26, 1985

[51] Int. Cl.$^4$ .............................................. H01H 35/00
[52] U.S. Cl. ..................................... 307/116; 307/115; 200/DIG. 1; 340/365 C; 361/179; 315/208; 315/205
[58] Field of Search ............... 307/116, 115, 117, 141, 307/141.14; 200/DIG. 1, 52 UX; 340/365 C, 530; 315/22 R, 230, 232, 234, 238, 240, 241 R, 244, 245, 205, 208

[56] References Cited

U.S. PATENT DOCUMENTS

| | | | |
|---|---|---|---|
| 2,896,131 | 7/1959 | Schumann | 361/179 |
| 3,493,791 | 2/1970 | Adelson et al. | 361/179 X |
| 3,530,310 | 9/1970 | Adelson et al. | 340/365 C X |
| 3,549,909 | 12/1970 | Elmsford | 361/179 X |
| 3,641,410 | 2/1972 | Vogelsberg | 200/DIG. 1 X |
| 3,651,391 | 3/1972 | Vogelsberg | 200/DIG. 1 X |
| 3,713,126 | 1/1973 | Stettner | 340/566 X |
| 3,857,100 | 12/1974 | Baars | 307/116 X |
| 3,899,713 | 8/1975 | Barken et al. | 315/205 X |
| 3,922,563 | 11/1975 | Penman | 307/116 |
| 3,965,465 | 6/1976 | Alexander | 200/DIG. 1 X |
| 4,063,111 | 12/1977 | Dobler et al. | 307/116 |
| 4,152,629 | 5/1979 | Raupp | 307/116 X |
| 4,194,143 | 3/1980 | Farkas et al. | 315/208 X |
| 4,360,737 | 11/1982 | Leopold | 307/116 |
| 4,490,625 | 12/1984 | Dilly | 307/116 |

FOREIGN PATENT DOCUMENTS 2931880 10/1980 Fed. Rep. of Germany .
2344175 10/1977 France .

Primary Examiner—William M. Shoop, Jr.
Assistant Examiner—Shik Luen Paul Ip

[57] ABSTRACT

A touch operated electronic switch for alternating current including a full wave rectifying bridge and two unidirectional current electronic switches one being mounted in parallel with said bridge input and the other being mounted in parallel with said bridge output, each unidirectional current electronic switch being such a silicon controlled rectifier which can be triggered by a touch plate. Said bridge input poles are the two external connections of said A.C. switch. Said unidirectional current electronic switch inserted between said bridge output poles is combined with a low inertia accumulator of electrical energy such as a capacitor mounted in parallel or an inductance mounted in series therewith. A device comprising a neon indicator and its dropping resistor is mounted in parallel with said bridge input so as to faintly light in transparency the touch operated electronic switch for A.C. when it is turned off. Any such touch operated electronic switch for alternating current acts as a multiple-way switch of a load when it is mounted in parallel with any number of same switches by said bridge input on the only two leads which conduct one to the load and the other to an A.C. potential source.

6 Claims, 2 Drawing Figures

TOUCH OPERATED ELECTRONIC SWITCH FOR ALTERNATING CURRENT

"CROSS-REFERENCES"

This application follows the French application No. 83 03194 filed on Feb. 23, 1983 by same inventor. The french application has been published on Aug. 24, 1984, that is to say less than a year ago, and the related Patent has not yet been granted.

BACKGROUND OF THE INVENTION

1. Field of the invention

The present invention relates to a low cost electronic switch for alternating current and more specifically to a touch operated switch that:
 allows a multiple-way operation of a load such as a lamp or a relay by any number of same switches with only two connection leads: one towards the load and one towards an A.C. potential source,
 involves two distinct touch plates: one for the "turning on" and the other for the "turning off" of the switch,
 and need not a permanent human contact on a touch plate to remain in "on" or "off" condition.

2. Prior Art

Prior art switches for alternating current suffer from various sorts of disadvantages. Thus, among the touch operated electronic switches:
 the device of Penman's U.S. Pat. No. 3,922,563 requires a permanent human contact on a touch plate for remaining in turning on condition;
 the device of Johnson's U.S. Pat. No. 3,549,905 besides the fact it is rather complex and hence expensive and liable to failure involves an oscillator and an antenna which are subject either to induce or to undergo interferences;
 the devices marketed by the French firm "Legrand" are very expensive and cannot operate a load under a minimal power (40 W to 75 W) that which is on the average just above the usual power of the electic lamps used at home and in the motel rooms (40 W to 60W);
 moreover, none of these electronic devices and none of the devices in conformity with Brignet'French application No. 2,344,175 or with Gehl's German application No. 2,931,880 B1 can be coupled with a device identical to itself to provide a two-way system for operating a given load. For a multiple-way operation purpose, Legrand devices can only be coupled with another type of device: a push-button switch and in this case it requires three connections and can bear only a limited number of such auxiliary devices. For the other above-cited devices which are known by their Patents or their published applications nothing in their specification or their drawings shows how these devices can be used for a multiple-way operation of a load.

For the mechanical actuated contact switches it is well known (see U.S. Pat. No. 3,922,563 already cited) that their main drawbacks are their subjection to wear and their uneasyness to be operated.

Furthermore such switches require three connections each for a two-way operation of a load and for a n-way operation of a load, two such switches require to be related through n−2 permuting device with four connections each. Such a number of connections implies multiplicity of leads, hence complexity and heaviness for electrifying a room with several issues when multiple-way operation of a lighting device is required from all the issues of the room.

For the prior art it must be told in addition that three out of the four electronic switches for which the drawings are disclosed by the Patents or applications cited here above, are based on the use of a full wave rectifying bridge of diodes with a silicon controlled rectifier and a capacitor mounted in parallel on the ouput of said bridge (see U.S. Pat. No. 3,549,905, French application No. 2,344,175, German application No. 2,931,880 B1). Said bridge input is connected by one of its pole to a load and by its other pole to an alternating current potential source. But that sort of construction did not allow up to now such a switch when coupled with an identical switch to itself to perform a two-operation of a load.

SUMMARY OF THE INVENTION

A touch operated electronic switch for A.C. according to the present invention belongs to the category of the switches which include a full wave rectifying bridge having one of its input connected to a load such a lamp or a relay and the other pole of its input connected to an A.C. potential source, the output of said bridge being mounted in parallel with an unidirectional current electronic switch such as a silicon controlled rectifier itself combined with a low inertia accumulator of electrical energy such as a capacitor. With the foregoing in mind up to now such switches did not require a permanent contact on a touch plate to remain in "on" or "off" condition nor require a minimal power for the load but were complex and hence subject to frequent failure, also expensive and anyway could not be used as multiple-way switches.

It is the primary object of the present invention to improve this category of A.C. switches by putting in parallel with said bridge input a supplementary unidirectional current electronic switch such as a silicon controlled rectifier, the anode of said supplementary unidirectional current electronic switch being linked to said input pole connected to the load. Owing to this supplementary unidirectional current electronic switch an installation in parallel of any number of so improved A.C. electronic switches between an A.C. potential source and a load, said A.C. switches still using therefore two connections, one connected to a lead conducting to an A.C. potential source and the other connected to a lead conducting to a load, provides a multiple-way operation of the load. Any A.C. switch of such an installation can be in "on" or "off" condition without being troubled whether the remaining A.C. switches of the installation are in "on" or "off" condition. But the triggering into conduction of the supplementary unidirectional current electronic switch any A.C. switch of the installation whether this last switch is in "on" or "off" condition will put into "off" condition all the A.C. switches which were previously in "on" condition. Once all the A.C. switches of the installation are in "off" condition, the load is no longer fed from the A.C. source. Then if the normal unidirectional current electronic switch of any A.C. switch of the installation is triggered into conduction, said A.C. switch is turned on and the load is again fed from the A.C. source. The reasons for these particularities for functioning will be more apparent from the following detailed description, taken with reference to the accompanying drawings.

The touch operated electronic switch for alternating current improved according to the present invention have thus two distinct touch plates the "on" touch plate for triggering the normal unidirectional current electronic switch and the "off" touch plate for triggering the supplementary unidirectional current electronic switch.

It is a further paramount object of the present invention to reduce the triggering circuit of the normal unidirectional current electronic switch to the practicable minimum i.e. an interference by-pass capacitor, a safety resistor and a touch plate so as to avoid all kinds of sophisticated functioning such the using of an oscillator and thus to get the lowest price of manufacturing and the maximum of reliability. The same type of minimum triggering circuit is of course used for the supplementary unidirectional current electronic switch.

It is another object of the present invention to provive a faint lightening in transparency behind the "off" touch plate so as to easily locate the A.C. switch in the dark for lighting the lamp(s) of a room. To that purpose a neon indicator in series with its protective resistor against overintensity is mounted in parallel with said bridge input and said neon indicator is placed behind the "off" touch plate made of a transparent material.

Other objects of the present invention will appear further on in the following description of the embodiments.

DETAILED DESCRIPTION OF THE ILLUSTRATED EMBODIMENTS

Figure 1:
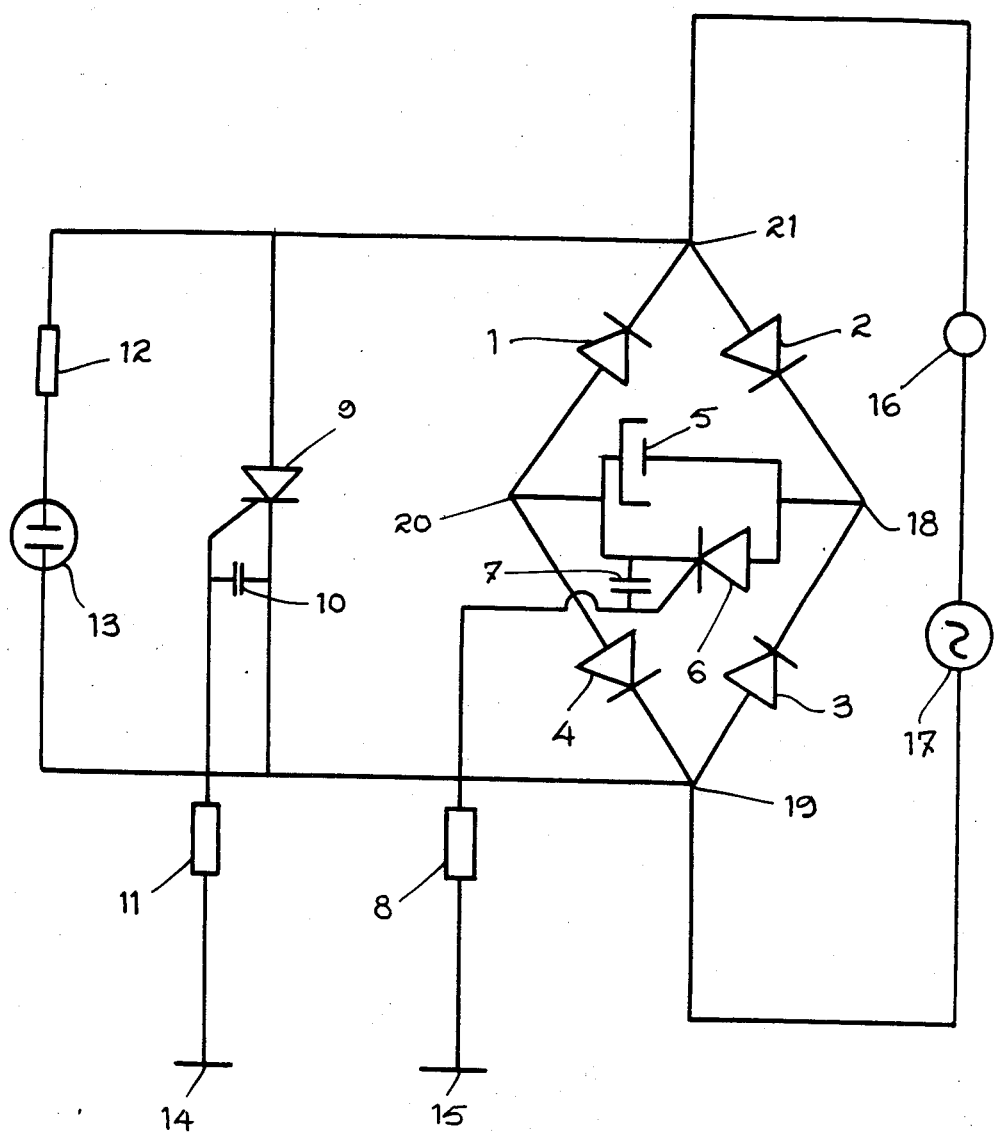
FIG. 1 is a circuit diagram of one presently preferred embodiment according to the present invention the present.

Reference is now made to FIG. 1 which illustrates a presently preferred touch operated switch for alternating current. Diodes 1-4 are connected into a full wave rectifying bridge having one pole 21 of its input linked to a load 16 and the other pole 19 of its input being linked to an A.C. potential source 17. The pole 18 of said bridge output at the juncture of the cathodes of said bridge diodes 2 and 3 is connected both to the anode of a silicon controlled rectifier 6 and to the plus of a polarized capacitor 5 and the other pole 20 of said bridge output at the juncture of the anodes of said bridge diodes 1 and 4 is connected to the cathode of said silicon controlled rectifier 6 and to the minus of said polarized capacitor 5. A supplementary silicon controlled rectifier 9 has its anode connected to the pole 21 of said bridge input which is linked to the load and has its cathode connected to the other pole 19 of said bridge input.

A neon indicator 13 serially connected with its its dropping resistor 12 is mounted in parallel with said bridge input.

The cathode and the gate of either of said silicon controlled rectifiers 6 and 9 are linked through an interference by-pass capacitor 7 or 10. The gate of either of said silicon controlled rectifiers 6 and 9 is linked to a conductive touch plate 15 or 14 through a safety resistor 8 or 11.

Both touch plates 14-15 being insulated from each other are parts of the facade of the A.C. switch according to the present invention; this facade has not been pictured on the drawings.

Figure 2:
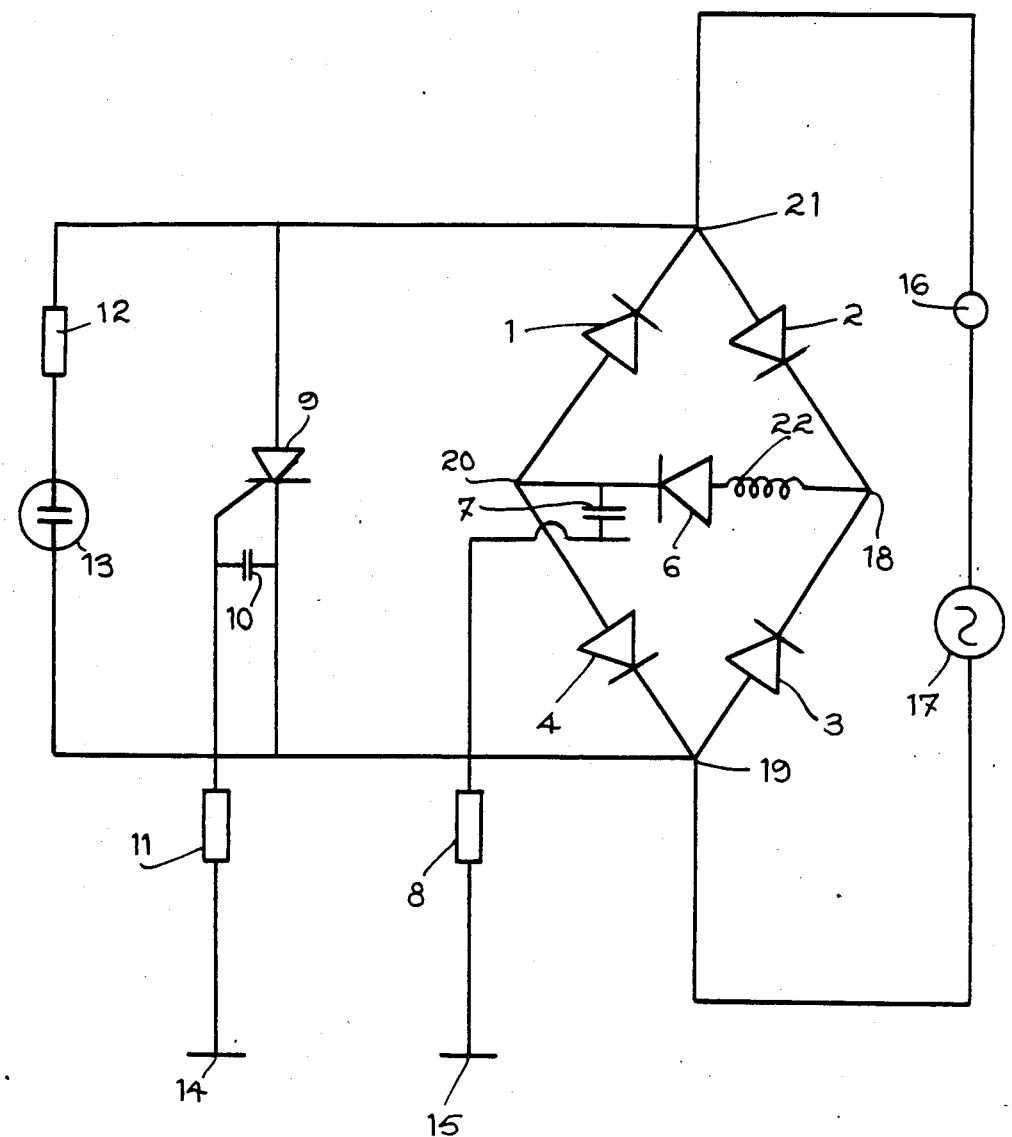
FIG. 2 is a second presently preferred embodiment of the present invention.

FIG. 2 is identical to FIG. 1 except that the mounting in parallel of a silicon controlled rectifier 6 and a polarized capacitor 5 of FIG. 1 is replaced by the mounting of an inductance in series with an identical silicon controlled rectifier 6 on the side of the anode thereof.

SINGLE-WAY OPERATION

In operation the A.C. electronic switch illustrated in FIG. 1 behaves like a bistable device: there are two stable phases and two ways of transition. The two stable phases are respectively the condition of turning on and the condition of turning off of said A.C. electronic switch. Said ways of transistion shift said A.C. electronic switch from one of said conditions to the other.

The two stable phases and the two ways of transition are described hereafter.

The turning on condition stands when silicon controlled rectifier 6 is conductive. Then the very low internal resistance of said silicon controlled rectifier 6 allows the polarized capacitor 5 through the full wave rectifying bridge into which diodes 1-4 are connected, to be only charged very below the maximum voltage that provides said A.C. potential source 17. So for the positive half waves, the current can flow from said A.C. potential source to the load 16 successively through diode 2, silicon controlled rectifier 6 shunted by polarized capacitor 5, and diode 1. And for the negative half waves, the current can flow from said load to said A.C. potential source successively through diode 2, silicon controlled rectifier 6 shunted by polarized capacitor 5, and diode 4. Thus the A.C. electronic switch illustrated on FIG. 1 according to the present invention is a full wave A.C. switch.

Said bridge input is then conductive for A.C. current when said silicon controlled rectifier 6 is turning on and its voltage between its input poles 19 and 21 is so low that the neon indicator 13 cannot be activated and thus the illuminating circuit 12-13 which is mounted in parallel with said bridge input is not lighted when said A.C. electronic switch is in turning on condition.

Said turning on condition is stable because when said silicon controlled rectifier 6 is conductive, its internal resistance is not zero. So the charge voltage of capacitor 5 to which said silicon controlled rectifier 6 is submitted between its anode and its cathode is sufficiently positive (slightly above half a volt provided the capacitance of capacitor 5 is high enough: above 1μF when effective A.C. potential source voltage is 117 V or 220 V and silicon controller rectifier 6 is a TIC 106 D to maintain said silicon controlled rectifier in conduction, even if no current flows from gate to cathode thereof; i.e. even if there is no human contact on the touch plate 15 (see futher on the description of the process of transition between turning on and turning off conditions of said A.C. electronic switch); that is a characteristic of the silicon controlled rectifiers. The fact that silicon controlled rectifier 6 is maintained conductive keeps up said A.C. electronic switch in turning on condition as it has been seen earlier.

On the contrary the turning off condition of said A.C. electronic switch illustrated in FIG. 1 stands when silicon controlled rectifier 6 is nonconductive. In this case, the full wave rectifying bridge into which said diodes 1-4 are connected behaves as it there was no load on its output; the capacitor 5 is full charged at the maximum voltage provided by the A.C. potential source 17 and that prevents said bridge input from being conductive between its poles 19 and 21 with respect to said A.C. potential source; the load 16 can no longer be fed from said A.C. potential source. If there was a slight leak across said polarized capacitor 5, a slight A.C. current could flow through said bridge between its input poles to feed load 16 from A.C. potential source 17 but this current sould ordinarily be insufficient to activate the load 16. That suggests that even with a slightly failed capacitor 5, the A.C. electronic switch according to FIG. 1 could be still validly operational and consequently that such an A.C. switch can have a long life. The load 16 being at most crossed by a very small current and having an internal resistance generally low (chiefly if it is a domestic lamp or relay), the voltage provided by the A.C. potential source is impressed nearly in its integrality between said bridge input poles 19 and 21. So inside the illuminating circuit which is mounted in parallel with said bridge input the neon indicator 13 can be activated through its serially connected dropping resistor 12 and thus said illuminating circuit is faintly lighted when said A.C. electronic switch is in turning off condition.

Said turning off condition is stable because as so long the silicon controlled rectifier 6 is not triggered, it remains nonconductive and that is sufficient as it has just been explained to block the conduction of said bridge input.

In operation the A.C. electronic switch illustrated in FIG. 2 behaves exactly like the A.C. electronic switch illustrated in FIG. 1 except that for the turning on condition it is the electromotive force generated in the inductance 22 which provides the positive voltage for maintaining silicon controlled rectifier 6 in condition. This electromotive force is negative between said bridge output pole 18 and the anode of silicon controlled rectifier 6, because electromagnetic induction originates it to prevent the current from flowing in the only direction it can do i.e. from anode to cathode of said silicon controlled rectifier 6. So through both the way of diodes 2 and 1 in succesion and the way of diodes 3 and 4 in succession from cathode to anode, said negative electromotive force applies a positive voltage between anode and cathode of said silicon controlled rectifier 6.

Taking into account the fact that the blocking voltage of a silicon controlled rectifier is very low (about half volt for a TIC 106D), it is not required that the inductance 22 value be high; besides a high value of the inductance 22 could encumber the functioning of the load 16.

For the turning off condition of the A.C. electronic switch illustrated in FIG. 2, inductance 22 does not play a role at all because it is serially connected to the silicon controlled rectifier 6 which is then nonconductive. Obviously the nonconduction of said silicon controlled rectifier is sufficient to block the conduction of said bridge between its input poles.

With the foregoing in mind, consideration is now given to the ways of transition from turning on to turning off conditions and from turning off to turning on conditions.

As it has been said above, both for the embodiment illustrated in FIG. 1 and for the embodiment illustrated in FIG. 2 turning on and turning off conditions correspond respectively to conduction and to nonconduction of silicon controlled rectifier 6. So it will be sufficient for both embodiments to describe the transition between said conditons as ways of changing the state of conduction of said silicon controlled rectifier 6.

At first is considered the way of transition from the turning on to the turning off conditions. One of said A.C. electronic switches illustrated in FIG. 1 or 2 consequently supposed to be in "on" condition that is to say its silicon controlled rectifier 6 is supposed to be conductive. When a human being connected to the ground by its internal resistance touches the touch plate 14, for the following first negative half wave, a current flows from the ground to the A.C. potential source 17 via in succession the human being internal resistance, the safety resistor 11 against overintensity, the internal link within the silicon controlled rectifier 9 from its gate to its cathode and said bridge input pole 19. This current triggers silicon controlled rectifier 9 into conduction and said silicon controlled rectifier 9 short-circuites said bridge input with respect to the feeding of the load 16 from the A.C. potential source. In these circumstances there is a reduction of the current inside the link between said bridge output poles 18 and 20. So polarized capacitor 5 of FIG. 1 discharges further and the voltage between its poles becomes too low for maintaining silicon controlled rectifier 6 in conduction. Inductance 22 of FIG. 2 tends to originate by electromagnetic induction a positive electromotive force from said bridge output pole 18 to the anode of silicon controlled rectifier 6 to slow said reduction of current and so no positive voltage can any longer by applied between anode and cathode of said silicon controlled rectifier 6 for maintaining it in conduction. Assuming there is no human contact on the touch plate 15 which is quite distinct from the touch plate 14, silicon controlled rectifier 6 becomes nonconductive. As soon as the human contact stops on the touch plate 14, the voltage increases again at said bridge input, but as the silicon controlled rectifier 6 is nonconductive, any of said A.C. electronic switches illustrated in FIG. 1 or 2 falls into "off" conditon.

Now is considered the transition from the turning off to the turning on conditions. One of said A.C. electronic switches illustrated in FIGS. 1 or 2 is consequently supposed to be in "off" conduction that is to say its silicon controlled rectifier 6 is supposed to be nonconductive. When a human being connected to the ground by its internal resistance touches the touch plate 15, for the following first negative half wave, a current flows from the ground to the A.C. potential source 17 via in succession the human being internal resistance, the safety resistor 8 against overintensity, the internal link within said silicon controlled rectifier 6 from its gate to its cathode, said diode 5 form anode to cathode, and said bridge input pole 19. This current triggers said silicon controlled rectifier 6 into conduction. Said polarized capacitor 5 of FIG. 1 discharges into said silicon controlled rectifier 6 down to the voltage sufficient, as it has been earlier, for maintaining said silicon controlled rectifier 6 in conduction. Said inductance 22 of FIG. 2 tends to originate by electromagnetic induction a negative electromotive force between said bridge output pole 18 and the anode of silicon controlled rectifier 6 to slow the increase of current through itself and as it has been said earlier, such a negative electromotive force is favorable for maintaining said silicon controlled rectifier 6 in conduction. So any of said A.C. electronic switches which have been here considered is thus shifted in turning on condition.

MULTIPLE-WAY OPERATION

Firstly, it has been seen in the description of the transition from turning on to turning off conditions of an A.C. electronic switch according to the present invention, that triggering into conduction the silicon controlled rectifier 9 mounted in parallel with the bridge input of said A.C. electronic switch is sufficient to turn off said A.C. electronic switch. That means that whatever the number of such A.C. electronic switches mounted in parallel by their input between the lead going towards the load 16 and the lead going towards the A.C. potential source, the triggering into conduction of the silicon controlled rectifier 9 of any said A.C. electronic switches is sufficient to turn off all of said A.C. electronic switches which were turned on before said triggering. That means therefore that in such an installation in parallel of any number of A.C. electronic switches according to the present invention, the turning off is possible from any of said A.C. switches.

Secondly, it has also been seen in the description of the transition from turning on to turning off conditions of an A.C. electronic switch according to the present invention, that once such an A.C. electronic switch has been turned off by the triggering into conduction of silicon controlled rectifier 9 and the human contact has ceased on the touch plate 14, there only remains a poor A.C. conduction between bridge input poles of said A.C. electronic switch, the remaining conduction coming chiefly from the illuminating circuit 12-13. So any number of A.C. electronic switches according to the present invention can be in "on" condition and mounted in parallel by said bridge input with any number of such switches in "off" condition without being troubled.

Thirdly, it has also been seen in the description of the transition from turning off to turning on conditions of an A.C. electronic switch according to the present invention, that the turning on of said A.C. switch results from the triggering into conduction of silicon controlled rectifier 6, that is to say from an action which is quite internal to said bridge. So the turning on of one of any number of A.C. electronic switches according to the present invention mounted in parallel by their bridge input cannot trouble the others, whether these ones are in "off" or "on" conditon.

From the three above considerations, it appears that any number of A.C. electronic switches according to the present invention can be mounted in parallel by their said bridge input on only two leads, one conducting to an A.C. potential source and the other to a load to provide a multiple-way operation of this load.

Moreover said A.C. electronic switches having to be connected to only such leads can obviously replace all kinds of mechanicals switches and this replacement makes possible a simplification of the network of leads when this one was used for a multiple-way operation of a load.

At last it must be noticed that when there is an A.C. power failure for any A.C. electronic switch according to the present invention, the voltage becomes null between its bridge input poles; so if said A.C. switch is in "on" conditon, it is as if its silicon controlled rectifier 9 has been triggered into conduction. Consequently as it has been seen in the foregoing said A.C. electronic switch shifts into turning off condition. That means that when there is a failure of power all the lights and delicate electrical apparatus operated by such A.C. electronic switches are automtically switched off that which may give a tranquillity feeling when one has to leave before A.C. power recovery. That also means that is sufficient to switch off the general power to turn off on one stroke all the A.C. electronic switches according to the present invention which could be used whatever their number.

The present invention may be embodied in other specific forms without departing from the spirit or essentials characteristics thereof. In particular each of said silicon controlled rectifier can be replaced by an unidirectional current electronic switch such as a combination of transistors or a thyratron and also in said illuminating circuit the neon indicator can be replaced by any kind of electrical device for faint lightening. So the present embodiments are therefore to be considered in all respects as illustrative and not restrictive, and all changes which come within the meaning and range of equivalency of the claims are therefore intended to be embraced therein.

What is claimed is:

1. A touch operated electronic switch for alternating current comprising in combination only
    a full wave rectifying bridge having one pole of its input connected to a load such as a lamp or a relay and the other pole of said input connected to an A.C. potential source,
    a first unidirectional conducting device such as a silicon controlled rectifier, mounted in parallel with said bridge output from the plus to the minus poles thereof, said first unidirectional conducting device being coupled to a reactance circuit element and
    a second unidirectional conducting device such as a silicon controlled rectifier mounted in parallel with said bridge input from the pole thereof connected to the load to the other pole thereof connected to said A.C. potential source.

2. A touch operated electronic switch for alternating current according to claim 1, wherein said reactance circuit element is one inductance mounted in series with said first unidirectional conducting device between the anode thereof and the plus pole of said bridge output.

3. A touch operated electronic switch for alternating current according to claim 1, wherein the gate of said first unidirectional conducting device is linked for the turning on of said touch operated electronic switch for alternating current to a conductive plate through only a resistor for current limitation.

4. A touch operated electronic switch for alternating current according to claim 1, wherein the gate of said second unidirectional conducting device is linked for the turning off of said touch operated electronic switch for alternating current to a conductive plate through only a resistor for current limitation.

5. A touch operated electronic switch for alternating current according to claim 1, wherein a dim circuit constituted by a neon indicator connected in series with its resistor for current limitation, is mounted in parallel with said bridge input behind a transparent portion of the facade of said touch operated electronic switch for alternating current.

6. A touch operated electronic switch for alternating current according to claim 1, wherein said reactance circuit element is one capacitor mounted in parallel with said first unidirectional conducting device.

* * * * *